(12) United States Patent
Hiner et al.

(10) Patent No.: US 8,826,531 B1
(45) Date of Patent: Sep. 9, 2014

(54) METHOD FOR MAKING AN INTEGRATED CIRCUIT SUBSTRATE HAVING LAMINATED LASER-EMBEDDED CIRCUIT LAYERS

(75) Inventors: David Jon Hiner, Chandler, AZ (US); Ronald Patrick Huemoeller, Chandler, AZ (US); Sukianto Rusli, Phoenix, AZ (US)

(73) Assignee: Amkor Technology, Inc.

( * ) Notice: Subject to any disclaimer, the term of this patent is extended or adjusted under 35 U.S.C. 154(b) by 1657 days.

(21) Appl. No.: 11/098,995

(22) Filed: Apr. 5, 2005

(51) Int. Cl.
*H01R 43/00* (2006.01)
*H05K 13/00* (2006.01)

(52) U.S. Cl.
USPC ............... 29/854; 29/825; 29/830; 29/846

(58) Field of Classification Search
USPC ........... 29/854, 825, 830, 843, 846, 847, 852; 156/89.16, 253; 257/635, 698; 438/106, 108
See application file for complete search history.

(56) References Cited

U.S. PATENT DOCUMENTS

| | | | |
|---|---|---|---|
| 3,324,014 A | 6/1967 | Modjeska | 205/122 |
| 3,778,900 A | 12/1973 | Haining et al. | 29/628 |
| 3,868,724 A | 2/1975 | Perrino | 357/65 |
| 3,916,434 A | 10/1975 | Garboushian | 357/74 |
| 4,322,778 A | 3/1982 | Barbour et al. | |
| 4,508,754 A | 4/1985 | Stepan | 427/53.1 |
| 4,532,152 A | 7/1985 | Elarde | 427/96 |
| 4,532,419 A | 7/1985 | Takeda | 235/492 |
| 4,604,799 A | 8/1986 | Gurol | 29/847 |
| 4,642,160 A | 2/1987 | Burgess | |
| 4,685,033 A | 8/1987 | Inone | |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,806,188 A * | 2/1989 | Rellick | 156/89.16 |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Thiem Phan
(74) *Attorney, Agent, or Firm* — McAndrews, Held & Malloy, Ltd.

(57) ABSTRACT

A method for making an integrated circuit substrate having laminated laser-embedded circuit layers provides a multi-layer high-density mounting and interconnect structure for integrated circuits. A prepared substrate, which may be a rigid double-sided dielectric or film dielectric with conductive patterns plated, etched or printed on one or both sides is laminated with a thin-film dielectric on one or both sides. The thin-film is laser-ablated to form channels and via apertures and conductive material is plated or paste screened into the channels and apertures, forming a conductive interconnect pattern that is isolated by the channel sides and vias through to the conductive patterns on the prepared substrate. An integrated circuit die and external terminals can then be attached to the substrate, providing an integrated circuit having a high-density interconnect.

14 Claims, 3 Drawing Sheets

(56) References Cited

U.S. PATENT DOCUMENTS

| | | | |
|---|---|---|---|
| 4,811,082 A | 3/1989 | Jacobs et al. | |
| 4,897,338 A | 1/1990 | Spicciati et al. | 430/314 |
| 4,905,124 A | 2/1990 | Banjo et al. | 361/395 |
| 4,915,983 A | 4/1990 | Lake et al. | 430/314 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | |
| 5,053,357 A | 10/1991 | Lin et al. | 437/204 |
| 5,072,075 A | 12/1991 | Lee et al. | |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | |
| 5,229,550 A | 7/1993 | Birdra et al. | |
| 5,239,448 A | 8/1993 | Perkins et al. | |
| 5,247,429 A | 9/1993 | Iwase et al. | 362/29 |
| 5,263,243 A | 11/1993 | Taneda et al. | 29/830 |
| 5,283,459 A | 2/1994 | Hirano et al. | 257/419 |
| 5,293,243 A | 3/1994 | Degnan et al. | |
| 5,371,654 A | 12/1994 | Beaman et al. | 361/744 |
| 5,379,191 A | 1/1995 | Carey et al. | 361/777 |
| 5,404,044 A | 4/1995 | Booth et al. | |
| 5,440,805 A | 8/1995 | Daigle et al. | 29/830 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,579 A | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 5,990,546 A | 11/1999 | Igarashi et al. | 257/700 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,035,527 A | 3/2000 | Tamm | |
| 6,039,889 A | 3/2000 | Zhang et al. | |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | |
| 6,115,910 A | 9/2000 | Ghahghahi | 29/833 |
| 6,119,338 A | 9/2000 | Wang et al. | 29/852 |
| 6,122,171 A | 9/2000 | Akram et al. | 361/704 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,162,365 A | 12/2000 | Bhatt et al. | 216/13 |
| 6,172,419 B1 | 1/2001 | Kinsman | 257/737 |
| 6,175,087 B1 | 1/2001 | Keesler et al. | |
| 6,184,463 B1 | 2/2001 | Panchou et al. | 174/52.4 |
| 6,194,250 B1 | 2/2001 | Melton et al. | |
| 6,204,453 B1 | 3/2001 | Fallon et al. | |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 * | 2/2002 | Iijima et al. | 257/698 |
| 6,352,914 B2 | 3/2002 | Ball et al. | 438/599 |
| 6,353,999 B1 | 3/2002 | Cheng | 29/852 |
| 6,365,975 B1 | 4/2002 | DiStefano et al. | |
| 6,368,967 B1 | 4/2002 | Besser | 438/687 |
| 6,376,906 B1 | 4/2002 | Asai et al. | |
| 6,378,201 B1 | 4/2002 | Tsukada et al. | 29/852 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,418,615 B1 | 7/2002 | Rokugawa et al. | 29/852 |
| 6,426,550 B2 | 7/2002 | Ball et al. | 257/700 |
| 6,451,509 B2 | 9/2002 | Keesler et al. | 430/311 |
| 6,472,306 B1 | 10/2002 | Lee et al. | 438/623 |
| 6,479,762 B2 | 11/2002 | Kusaka | 174/261 |
| 6,497,943 B1 | 12/2002 | Jimarez et al. | 428/209 |
| 6,502,774 B1 | 1/2003 | Johansson et al. | 241/37 |
| 6,517,995 B1 | 2/2003 | Jacobson et al. | 430/320 |
| 6,528,874 B1 | 3/2003 | Iijima et al. | |
| 6,534,391 B1 | 3/2003 | Huemoeller et al. | 438/612 |
| 6,534,723 B1 | 3/2003 | Asai et al. | 174/255 |
| 6,544,638 B2 | 4/2003 | Fischer et al. | 428/322.7 |
| 6,570,258 B2 | 5/2003 | Ma et al. | 257/774 |
| 6,574,106 B2 | 6/2003 | Mori | 361/705 |
| 6,586,682 B2 | 7/2003 | Strandberg | 174/255 |
| 6,608,757 B1 | 8/2003 | Bhatt et al. | |
| 6,637,105 B1 | 10/2003 | Watanabe et al. | 29/852 |
| 6,660,559 B1 | 12/2003 | Huemoeller et al. | 438/106 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,740,964 B2 | 5/2004 | Sasaki | |
| 6,753,612 B2 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,804,881 B1 * | 10/2004 | Shipley et al. | 29/830 |
| 6,815,709 B2 | 11/2004 | Clothier et al. | |
| 6,815,739 B2 | 11/2004 | Huff et al. | 257/275 |
| 6,822,334 B2 | 11/2004 | Hori et al. | 257/775 |
| 6,891,261 B2 | 5/2005 | Awaya | 257/692 |
| 6,908,863 B2 | 6/2005 | Barns et al. | |
| 6,913,952 B2 | 7/2005 | Moxham et al. | 438/125 |
| 6,919,514 B2 | 7/2005 | Konrad et al. | |
| 6,930,256 B1 | 8/2005 | Huemoeller et al. | 174/260 |
| 6,930,257 B1 | 8/2005 | Hiner et al. | 174/262 |
| 6,940,170 B2 | 9/2005 | Parikh | 257/750 |
| 6,989,593 B2 | 1/2006 | Khan et al. | 257/707 |
| 6,998,335 B2 | 2/2006 | Fan et al. | 438/612 |
| 7,028,400 B1 | 4/2006 | Hiner et al. | 29/852 |
| 7,033,928 B2 | 4/2006 | Kawano | 438/637 |
| 7,061,095 B2 | 6/2006 | Boggs et al. | |
| 7,145,238 B1 | 12/2006 | Huemoeller et al. | 257/750 |
| 7,214,609 B2 | 5/2007 | Jiang et al. | 438/637 |
| 7,242,081 B1 | 7/2007 | Lee | |
| 7,292,056 B2 | 11/2007 | Matsuda | |
| 7,345,361 B2 | 3/2008 | Mallik et al. | |
| 7,372,151 B1 | 5/2008 | Fan et al. | |
| 7,435,352 B2 | 10/2008 | Mok et al. | |
| 2001/0041436 A1 | 11/2001 | Parikh | |
| 2002/0017712 A1 | 2/2002 | Bessho et al. | 257/700 |
| 2002/0140105 A1 | 10/2002 | Higgins, III et al. | |
| 2003/0000738 A1 | 1/2003 | Rumsey et al. | 174/260 |
| 2003/0128096 A1 | 7/2003 | Mazzochette | 338/22 |
| 2005/0194353 A1 | 9/2005 | Johnson et al. | 216/65 |
| 2005/0205295 A1 | 9/2005 | Tsuk | |

(56) References Cited

U.S. PATENT DOCUMENTS

| | | |
|---|---|---|
| 2006/0157854 A1 | 7/2006 | Takewaki et al. |
| 2006/0197228 A1 | 9/2006 | Daubenspeck et al. |
| 2007/0114203 A1 | 5/2007 | Kang |
| 2007/0273049 A1 | 11/2007 | Khan et al. |
| 2007/0290376 A1 | 12/2007 | Zhao et al. |
| 2008/0230887 A1 | 9/2008 | Sun et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Wolf et al., "Silicon Processing for the VLSI Era: vol. 1—Process Technology", 1986, pp. 407-408.

Huemoeller et al., U.S. Appl. No. 10/947,124, filed Sep. 22, 2004, entitled "Method for Making an Integrated Circuit Substrate Having Embedded Back-Side Access Conductors and Vias".

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Huemoeller et al., U.S. Appl. No. 11/166,005, filed Jun. 24, 2005, entitled "Circuit-On-Foil Process for Manufacturing a Laminated Semiconductor Package Substrate Having Embedded Conductive Patterns".

Huemoeller et al., U.S. Appl. No. 11/182,985, filed Jul. 14, 2005, entitled "Semiconductor Package Having Laser-Embedded Terminals".

Huemoeller et al., U.S. Appl. No. 11/189,593, filed Jul. 26, 2005, entitled "Integral Plated Semiconductor Package Substrate Stiffener".

Huemoeller et al., U.S. Appl. No. 11/527,827, filed Sep. 26, 2006, entitled "Semiconductor Package and Substrate Having Multi-Level Vias Fabrication Method".

Huemoeller et al., U.S. Appl. No. 11/543,540, filed Oct. 4, 2006, entitled "Method and Structure for Creating Embedded Metal Features".

Rusli et al., U.S. Appl. No. 11/621,402, filed Jan. 9, 2007, entitled "Embedded Circuit Pattern Fabrication Method and Structure".

Huemoeller et al., U.S. Appl. No. 11/982,637, filed Nov. 1, 2007, entitled "Circuit-On-Foil Process for Manufacturing a Laminated Semiconductor Package Substrate Having Embedded Conductive Patterns".

Huemoeller et al., U.S. Appl. No. 11/903,002, filed Sep. 19, 2007, entitled "Substrate Having Stiffener Fabrication Method".

Huemoeller et al., "Multi-level Circuit Substrate and Fabrication Method", U.S. Appl. No. 12/151,857, filed May 9, 2008.

Hiner et al., "Extended Landing Pad Substrate Package Structure and Method", U.S. Appl. No. 12/351,596, filed Jan. 9, 2009.

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

Huemoeller et al., "Method and Structure for Creating Embedded Metal Features", U.S. Appl. No. 12/462,665, filed Aug. 5, 2009.

\* cited by examiner

METHOD FOR MAKING AN INTEGRATED CIRCUIT SUBSTRATE HAVING LAMINATED LASER-EMBEDDED CIRCUIT LAYERS

CROSS-REFERENCE TO RELATED APPLICATIONS

The present application is a divisional of U.S. patent application Ser. No. 10/392,738 entitled "INTEGRATED CIRCUIT SUBSTRATE HAVING LAMINATED LASER-EMBEDDED CIRCUIT LAYERS", now U.S. Pat. No. 6,930,257, issued Aug. 16, 2005, which is a Continuation-in-Part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, now U.S. Pat. No. 6,930,256, issued Aug. 16, 2005, by the same inventors and assigned to the same assignee. The above-referenced parent application is also a Continuation-in-Part of U.S. patent application entitled "INTEGRATED CIRCUIT FILM SUBSTRATE HAVING EMBEDDED CONDUCTIVE PATTERNS AND VIAS", Ser. No. 10/261,868 filed Oct. 1, 2002, now abandoned, having at least one common inventor and assigned to the same assignee. The specifications of the above-referenced patent applications are herein incorporated by reference.

FIELD OF THE INVENTION

The present invention relates generally to semiconductor packaging, and more specifically, to a substrate having laminated circuit layers added to a prepared substrate for providing electrical inter-connection within an integrated circuit package.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

Multi-layer substrates have been used to increase interconnect density, as a high interconnect density is required in present-day integrated circuits such as very-large-scale-integrated (VLSI) circuits. However, the cost of a typical multi-layer substrate is substantially higher than a single or double-sided circuit substrate. The thickness of a typical multi-layer substrate is generally a sum of equal dielectric layers along with the metal conductor layers.

Multi-layer substrate also typically have the same layer thickness and are limited to line pitch and conductor spacing without incorporating the advantages disclosed in the above-referenced patent applications.

Therefore, it would be desirable to provide a method and substrate having multiple conductive layers without the associated cost and thickness of a typical multi-layer substrate. It would further be desirable to provide increased conductor density and reduced inter-conductor spacing within an integrated substrate having multiple layers.

SUMMARY OF THE INVENTION

The above objectives of providing a thin, low-cost multi-layer substrate having increased interconnect density is provided in a substrate having laminated layers including laser-embedded conductive patterns and a method for manufacturing.

The substrate comprises a prepared substrate layer that may be a rigid dielectric layer or a film having conductive patterns disposed on one or more surfaces. One or more thin-film dielectric sheets are laminated on one or more sides of the prepared substrate and laser-embedding is used to generate a circuit pattern within the one or more thin-film dielectric sheets in order to embed conductors in channels beneath the surface of the thin-film dielectric sheets. Conductive material is then plated or paste screened into the channels. The process can be extended to multiple layers to create a sandwich structure for very high conductor density applications.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated patent applications disclose various processes and structures for manufacturing low-cost substrates having high conductor density and electrical integrity by laser-embedding conductive patterns below the surface of a substrate. The present invention transforms a prepared substrate having conductors etched, printed or plated on surfaces thereof into a laminated multi-layer substrate having laser-embedded conductors in the laminated layers. The addition of laser-embedded laminated layers provides a very high conductor density, while adding a low incremental cost to a low-cost substrate.

Figure 1A:
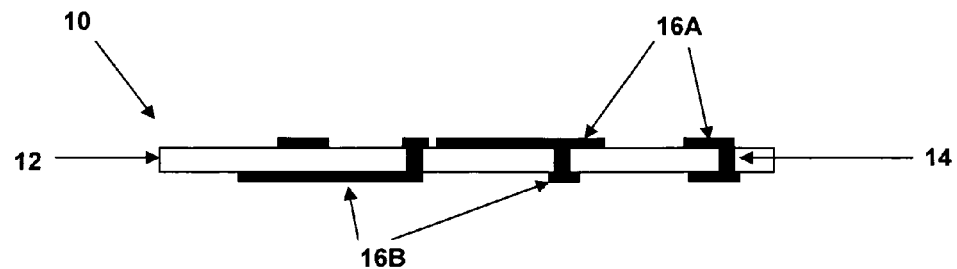
FIG. 1A is a pictorial diagram depicting a cross sectional side view of a prepared substrate for forming a laminated substrate in accordance with an embodiment of the invention.
Figure 1B:
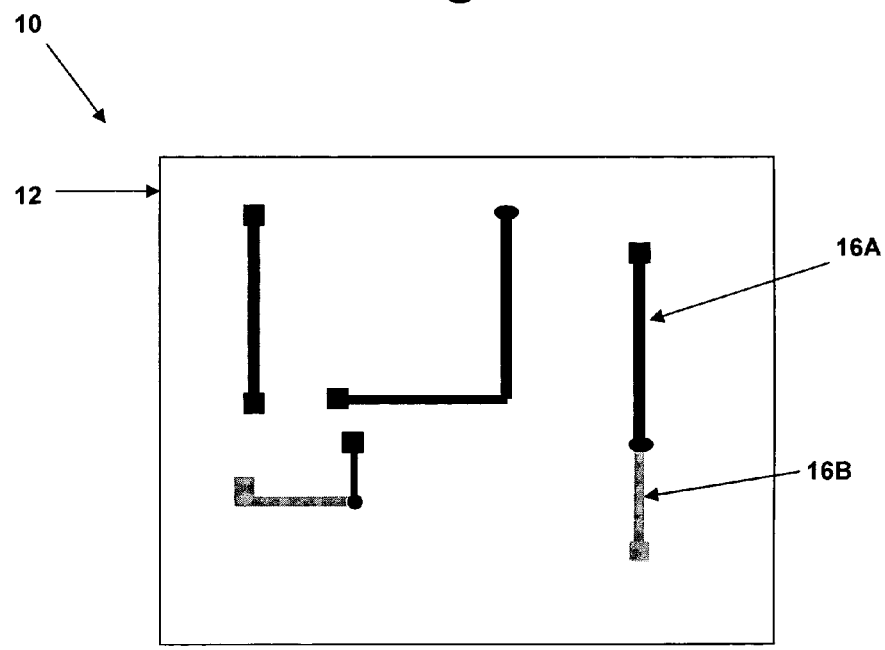
FIG. 1B is a pictorial diagram depicting a top view of a prepared substrate for forming a laminated substrate in accordance with an embodiment of the invention.

Referring now to the figures and in particular to FIG. 1A, a side view of prepared substrate 10 for use in forming a laminated substrate in accordance with an embodiment of the present invention is depicted. Circuit patterns are provided on both sides of substrate 10 by metal layers 16A and 16B with via connections 14 providing interconnectivity between metal layers 16A and 16B, but the present invention may be implemented with single-sided or multi-layer prepared substrates, as well. FIG. 1B shows a top view of prepared substrate 10 showing an exemplary pattern formed by metal layers 16A and 16B.

Figure 2A:
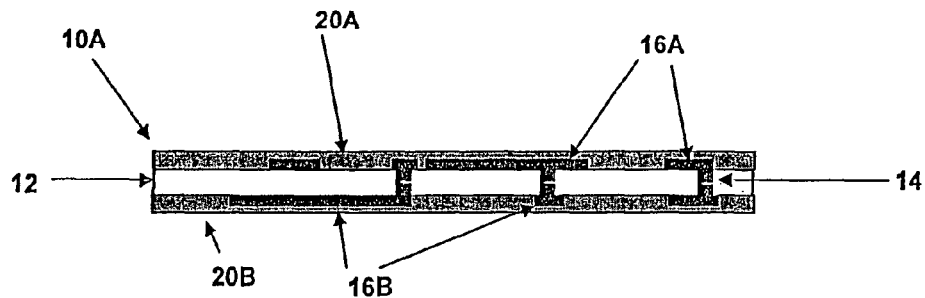
FIGS. 2A-2D are pictorial diagrams depicting cross-sectional side views of various stages of preparation of a laminated substrate in accordance with an embodiment of the invention.
Figure 2B:
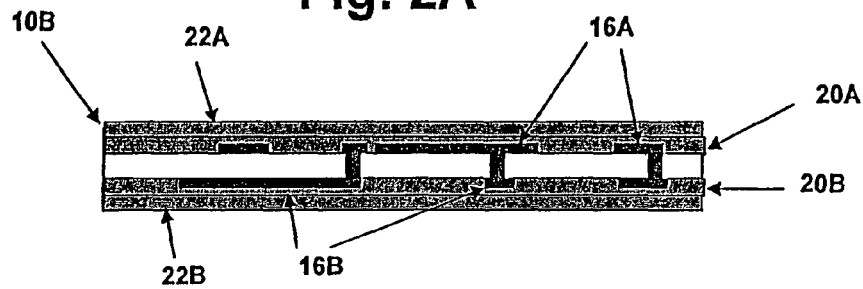

Referring now to FIG. 2A, the first stage in laminating the prepared substrate to form a modified substrate 10A is shown. Adhesive layers 20A and 20B are applied to each side of substrate 10 for attachment of thin-film dielectric layers. FIG. 2B shows application of thin film dielectric layers 22A and 22B to each side of substrate 10A to form laminated substrate 10B. While the depicted embodiment of the process shows a separate application of adhesive 20A and 20B and thin-film layers 22A and 22B, a single application of a film having an adhesive backing may be applied to prepared substrate 10 in accordance with another embodiment of the process of the present invention, yielding the structure depicted in FIG. 2B (substrate 10B) in a single application step.

Figure 2C:
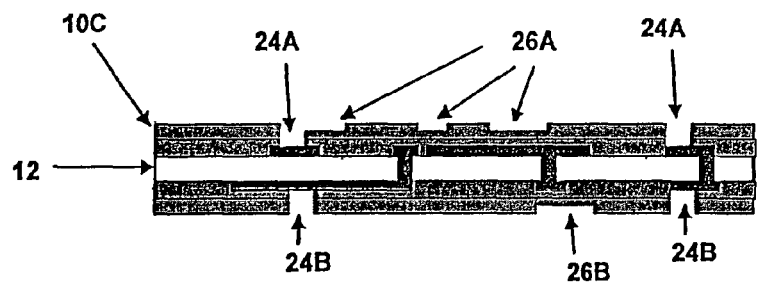
Figure 2D:
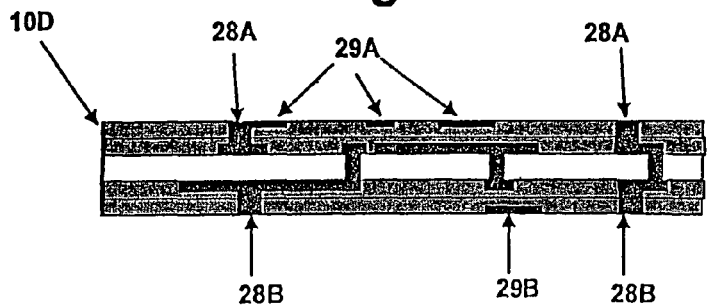

Referring now to FIG. 2C, laminated substrate 10B is laser-ablated on each side to form apertures 24A and 24B for vias, and channels 26A and 26B for circuit patterns. Channels 26A and 26B are shown as having a bottom within thin-film dielectric layers 22A and 22B, but laser-ablation may be performed to place the bottom of channels 26A and 26B at the top of or within adhesive layers 20A and 20B, providing direct contact with adhesive layers 20A and 20B and metal that will be subsequently deposited within channels 26A and 26B, improving the adhesion of the deposited metal to the substrate. In an alternative embodiment of the present invention, a thin-film dielectric layer having laser-ablated channels 26A and 26B and via apertures 24A and 24B may be aligned with and applied to substrate 10A in one step. Further, the alternative thin-film process may apply a thin-film dielectric layer having laser-ablated channels 26A and 26B and via apertures 24A and 24B along with an adhesive backing as described above may be aligned and applied to substrate 10 in a single step.

After substrate 10C is formed, metal is plated or paste-screened within channels 26A and 26B and via apertures 24A and 24B to form circuit patterns 29A, 29B and vias 28A, 28B beneath the top surface of substrate 10C forming substrate 10D. Metal may be over-plated and subsequently etched to conform with the outside surfaces of thin-film dielectric layers 22A and 22B, or may be slightly over-etched to place the outside surfaces of circuit patterns 29A, 293 and vias 28A, 288 below the outside surfaces of thin-film dielectric layers 22A and 22B. Alternatives to metal such as conductive polymers or materials having conductive fibers suspended in a mixture may also be applied within channels 26A and 26B and via apertures 24A and 24B to form circuit patterns 29A, 29B and vias 28A, 28B in accordance with alternative embodiments of the present invention.

The above-described process may be extended to the application of multiple thin-film laminations on a prepared substrate. Additional adhesive/thin-film/conductor layers may be applied as described above to substrate 10D with connections to channel 29A, 29B and via 28A, 28B conductors provided by vias laser-ablated through the additional thin-film dielectric layers. Via apertures may be laser-ablated through multiple thin-film laminations in one step, providing a uniform aperture wall for vias extending through multiple thin-film dielectric layers.

Figure 3A:
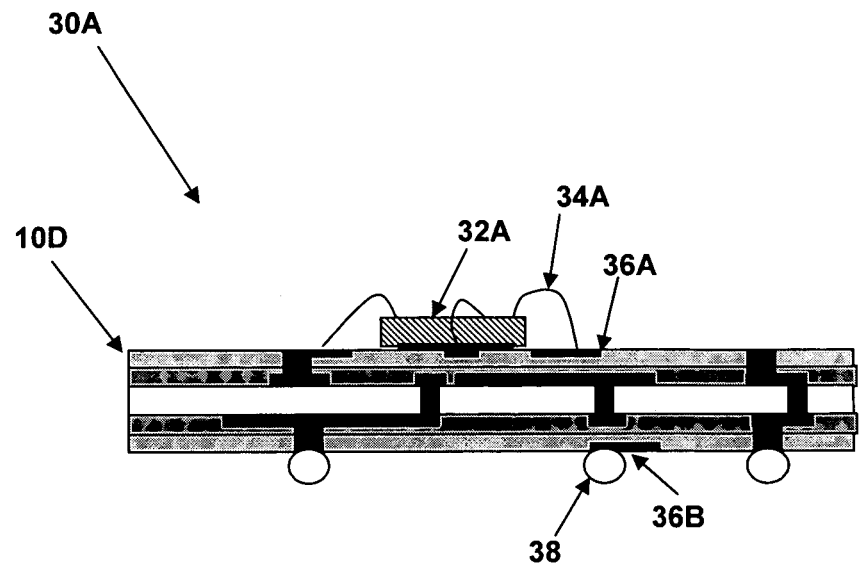
FIGS. 3A and 3B are pictorial diagrams depicting integrated circuits in accordance with embodiments of the invention.
Figure 3B:
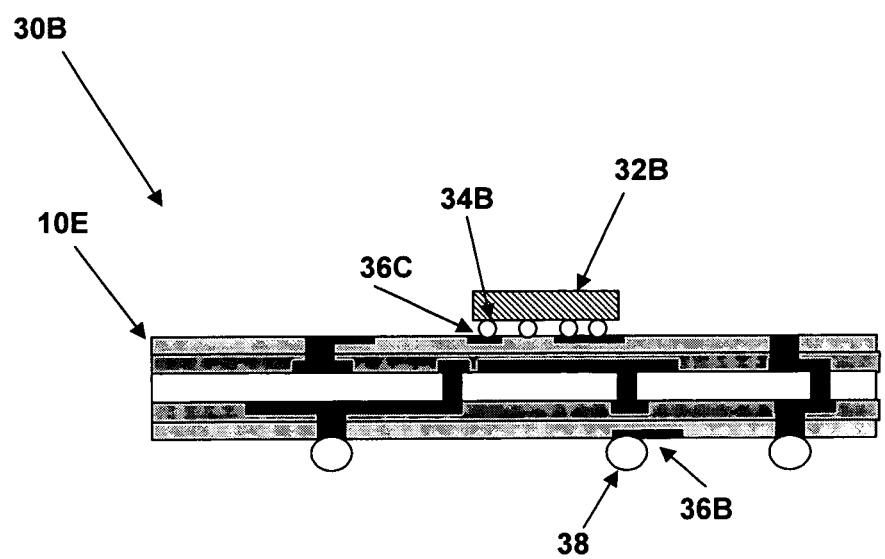

Referring now to FIG. 3A, an integrated circuit 30A in accordance with an embodiment of the present invention is depicted. An integrated circuit die 32A is attached to substrate 10D using a bonding agent such as epoxy. While die 32A is depicted as mounted above substrate 10D, a die mounting recess may also be laser-ablated or otherwise provided in substrate 10D, reducing the package height. For example, a die mounting aperture may be provided completely through thin-film dielectric layer 22A in an area free of channels and vias, to reduce the package height by the thickness of thin film-dielectric layer 22A. A cavity in prepared substrate 10 may also be provided and aligned with an aperture in thin-film dielectric layer 22A to further reduce package height.

Electrical interconnects 34A (wires) from die 32A are wire bonded to the circuit pattern on the top side of substrate 10D electrically connecting die 32A to bonding areas 36A provided by channel circuit patterns 29A and/or vias 28A. External terminals 38, depicted as solder balls, are attached to BGA lands 36B provided by channel circuit patterns 29B and/or vias 28B, providing a complete integrated circuit that may be encapsulated.

Referring now to FIG. 43B, an integrated circuit 30B in accordance with an alternative embodiment of the invention is depicted. Die 32B is a "flip-chip" die that is directly bonded to bonding areas 36C of a substrate 10E via solder balls 34B. External solder ball terminals 38 are provided as in the embodiment of FIG. 3A. Substrate 10E is fabricated in the same manner as substrate 10D, but may have a differing configuration to support the flip-chip die 32B interconnect.

The above description of embodiments of the invention is intended to be illustrative and not limiting. Other embodiments of this invention will be obvious to those skilled in the art in view of the above disclosure and fall within the scope of the present invention.

What is claimed is:

1. A method for manufacturing a substrate for a semiconductor package, comprising:
   laminating a thin-film dielectric layer to a dielectric layer having a plated, etched or printed circuit first conductive pattern on at least one side to produce a laminated assembly comprising:
       providing the dielectric layer with the first conductive pattern on the at least one side of the dielectric layer; and
       applying an adhesive layer simultaneously to both the at least one side of the dielectric layer and the first conductive pattern, the adhesive layer being on an inside surface of the thin-film dielectric layer opposing an outside surface of the thin-film dielectric layer, wherein the adhesive layer forms part of the thin-film dielectric layer;
   laser-drilling a plurality of perforations on the outside surface of the thin-film dielectric layer, wherein the perforations comprise:
       conductor channels from the outside surface of the thin-film dielectric layer to contact the adhesive layer, wherein the adhesive layer remains between the conductor channels and the first conductive pattern; and
       blind via holes formed from the outside surface of the thin-film dielectric layer through the thin-film dielectric layer and the adhesive layer to contact the first conductive pattern; and
   depositing metal within the perforations to form electrical contact to the first conductive pattern.

2. A method for manufacturing a substrate for a semiconductor package, comprising:
   laminating a thin-film dielectric layer to a dielectric layer having a plated, etched or printed circuit first conductive pattern on at least one side to produce a laminated assembly comprising:
       providing the dielectric layer with the first conductive pattern on the at least one side of the dielectric layer;
       applying an adhesive layer simultaneously to both the at least one side of the dielectric layer and the first conductive pattern; and
       applying an inside surface of the thin-film dielectric layer opposing an outside surface of the thin-film dielectric layer to the adhesive layer;
   laser-drilling a plurality of perforations on the outside surface of the thin-film dielectric layer, wherein the perforations comprise:

conductor channels from the outside surface of the thin-film dielectric layer to contact the adhesive layer, wherein the conductor channels comprise bottoms within the adhesive layer, wherein the adhesive layer remains between the bottoms of the conductor channels and the first conductive pattern; and blind via holes formed from the outside surface of the thin-film dielectric layer through the thin-film dielectric layer and the adhesive layer to contact the first conductive pattern; and depositing metal within the perforations to form electrical contact to the first conductive pattern.

3. The method of claim 2 further comprising: mounting the thin-film dielectric layer in a laser drilling machine.

4. The method of claim 3, wherein the mounting and laser-drilling are performed subsequent to the laminating.

5. The method of claim 3, wherein the mounting and laser-drilling are performed prior to the laminating.

6. The method of claim 3, wherein the dielectric layer is a tape having the first conductive pattern formed on a top side thereof, and wherein the laminating laminates the thin-film dielectric layer to the tape.

7. The method of claim 3, wherein the dielectric layer is a rigid dielectric having the first conductive pattern formed on a top side thereof, and wherein the laminating laminates the thin-film dielectric layer to the rigid dielectric.

8. The method of claim 3, wherein the laser-drilling drills at least a portion of the perforations such that the conductor channels are formed in the outside surface of the thin-film dielectric layer that do not contact the first conductive pattern.

9. The method of claim 3, wherein the depositing comprising plating metal within the perforations.

10. The method of claim 3, wherein the depositing comprising paste-screening metal within the perforations.

11. The method of claim 3, wherein the dielectric layer has a second conductive pattern formed on another side opposing the at least one side, and wherein the method further comprises:

second laminating another thin-film dielectric layer to the other side of the dielectric layer;

second mounting the other thin-film dielectric layer in a laser drilling machine;

second laser-drilling another plurality of perforations on an outside surface of the other thin-film dielectric layer; and second depositing metal within the other perforations to form electrical contact to the second conductive pattern.

12. The method of claim 11, wherein the dielectric layer is a multi-layer circuit board having at least one internal circuit material pattern, and wherein the second laser-drilling drills into the multi-layer circuit board to the at least one internal circuit material pattern, and wherein the second depositing deposits metal to make contact with the at least one internal circuit material pattern of the multi-layer circuit board.

13. The method of claim 2 wherein the depositing metal forms circuit patterns in the conductor channels and vias in the blind via holes, the circuit patterns and vias being beneath the outside surface of the thin-film dielectric layer.

14. A method for manufacturing a substrate for a semiconductor package, comprising:

laminating a thin-film dielectric layer to a dielectric layer having a plated, etched or printed circuit first conductive pattern on at least one side to produce a laminated assembly comprising:

providing the dielectric layer with the first conductive pattern on the at least one side of the dielectric layer;

applying an adhesive layer simultaneously to both the at least one side of the dielectric layer and the first conductive pattern; and applying an inside surface of the thin-film dielectric layer opposing an outside surface of the thin-film dielectric layer to the adhesive layer;

laser-drilling a plurality of perforations on the outside surface of the thin-film dielectric layer, wherein the perforations comprise:

conductor channels from the outside surface of the thin-film dielectric layer to contact the adhesive layer, wherein the conductor channels comprise bottoms at the top of the adhesive layer, wherein the adhesive layer remains between the bottoms of the conductor channels and the first conductive pattern; and blind via holes formed from the outside surface of the thin-film dielectric layer through the thin-film dielectric layer and the adhesive layer to contact the first conductive pattern; and depositing metal within the perforations to form electrical contact to the first conductive pattern.

* * * * *

UNITED STATES PATENT AND TRADEMARK OFFICE
CERTIFICATE OF CORRECTION

| | | |
|---|---|---|
| PATENT NO. | : 8,826,531 B1 | Page 1 of 1 |
| APPLICATION NO. | : 11/098995 | |
| DATED | : September 9, 2014 | |
| INVENTOR(S) | : Hiner et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1775 days.

Signed and Sealed this
Eighth Day of September, 2015

Michelle K. Lee
*Director of the United States Patent and Trademark Office*